US006809590B1

United States Patent
Wong et al.

(12) United States Patent
(10) Patent No.: US 6,809,590 B1
(45) Date of Patent: Oct. 26, 2004

(54) OUTPUT STAGE USING POSITIVE FEEDBACK TO PROVIDE LARGE CURRENT SOURCING CAPABILITY

(75) Inventors: Kae Wong, Dallas, TX (US); Xiaoyu Xi, Plano, TX (US)

(73) Assignee: Texas Instruments Incorporated, Dalls, TX (US)

( * ) Notice: Subject to any disclaimer, the term of this patent is extended or adjusted under 35 U.S.C. 154(b) by 10 days.

(21) Appl. No.: 10/436,010

(22) Filed: May 12, 2003

(51) Int. Cl.[7] .................................................. H03F 3/26
(52) U.S. Cl. ........................................ 330/265; 330/288
(58) Field of Search .............................. 330/265, 288, 330/277, 310, 296

(56) References Cited

U.S. PATENT DOCUMENTS

| 4,618,815 A | * | 10/1986 | Swanson | 323/315 |
| 5,359,296 A | * | 10/1994 | Brooks et al. | 330/288 |
| 5,952,884 A | * | 9/1999 | Ide | 330/288 |

* cited by examiner

*Primary Examiner*—Henry Choe
(74) *Attorney, Agent, or Firm*—Ronald O. Neerings; Wade James Brady, III; Frederick J. Telecky, Jr.

(57) ABSTRACT

An output stage provides increased current sourcing capability through a technique of local positive feedback. Current through a transistor MP2 is mirrored by the output current source $I_{OUT}$ that is desired to be increased. Without positive feedback, the gate of MN2 would be fixed by MP1 and MN1, and when input voltage $V_{IN}$ decreases by an incremental voltage $\Delta V$, the resulting current increase would distribute an increased voltage not only across MP2's $V_{GS}$ but also in the $V_{GS}$ of another transistor MN2; therefore, undesirably, not all of the $\Delta V$ voltage change is mirrored in $I_{OUT}$. However, if positive feedback such as MP5 is provided, the feedback dynamically increases the voltage at the gate of MN2. The increased voltage of MN2's gate essentially provides more voltage "headroom" for MP2 and MN2, and allows current through MP2 to increase with any voltage decrease in $V_{IN}$. Through current mirroring, the increased current through MP2 ultimately results in the desired higher maximum output current source $I_{OUT}$. This increase in output current sourcing is achieved with a minimal additional circuitry—a single transistor, MP5. The feedback is local (internal to the output stage), so that loop delay is minimal and response is fast. Further, because of improved DC gain within the output stage, the increased maximum $I_{OUT}$ is achieved without compromising other circuit parameters such as power supply rejection ratio (PSRR).

13 Claims, 4 Drawing Sheets

OUTPUT STAGE USING POSITIVE FEEDBACK TO PROVIDE LARGE CURRENT SOURCING CAPABILITY

BACKGROUND OF THE INVENTION

1. Field of the Invention

The invention generally relates to output stages of electronic components. More particularly, the invention relates to output stages in which increased current sourcing capability is desired.

2. Related Art

FIG. 1 depicts a conventional output stage that is suitable for use as an output buffer in, for example, Class AB amplifiers. While possessing favorable power supply rejection ratio (PSRR) performance, rail-to-rail output swing, and current sinking capability, the FIG. 1 circuit has relatively weak current sourcing capability ($I_{OUT}$ is undesirably small).

Due to current mirroring phenomena in the FIG. 1 configuration, the maximum output source current $I_{OUT}$ is ultimately determined by how much gate-to-source voltage ($V_{GS}$) can be applied to the MP2 sink. Assuming that all transistors in FIG. 1 are ideal and the same size, MN3 conducts $I_B$ when $V_{IN}$ is equal to $V_B$, a bias voltage applied to MP1. When $V_{IN}$ swings an incremental voltage amount $\Delta V$ below $V_B$, current through MP2 increases accordingly. In the illustrated configuration, this MP2 current increment is mirrored to MP4.

Unfortunately, only part of the input change $\Delta V$ in $V_{IN}$ is reflected as an increment in $V_{GS}$ for MP2. Because the gate-to-source voltage $V_{GS}$ for MN2 (connected above MP2) is fixed by the gate's connection to the gate of MN1, part of the $\Delta V$ is "absorbed" by $V_{GS}$ of MN2 to account for the current increment. Thus, because the maximum output source current $I_{OUT}$ is ultimately determined by how much gate-to-source voltage ($V_{GS}$) can be applied to the MP2 sink, $I_{OUT}$ does not adequately increase with $\Delta V$ variations in $V_{IN}$, resulting in undesirably small maximum output source current $I_{OUT}$.

Accordingly, there is a need in the art to provide increased current sourcing capability of circuits such as that illustrated in FIG. 1, preferably with minimal additional circuitry and without compromising other operational features of the circuit.

SUMMARY

Accordingly, there is provided an output stage for providing an increased current source output. The output stage has a first circuit element that carries a first current that varies in accordance with an input voltage and a feedback voltage that includes a first voltage across the first circuit element. The output stage also has a positive feedback arrangement that dynamically increases the feedback voltage in response to an increase in at least the first current, to supplement an increase in the first current beyond that caused by a change in the input voltage alone. The output stage also has a second circuit element that provides the increased current source output as a mirror of the first current.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which.

DETAILED DESCRIPTION

Figure 1:
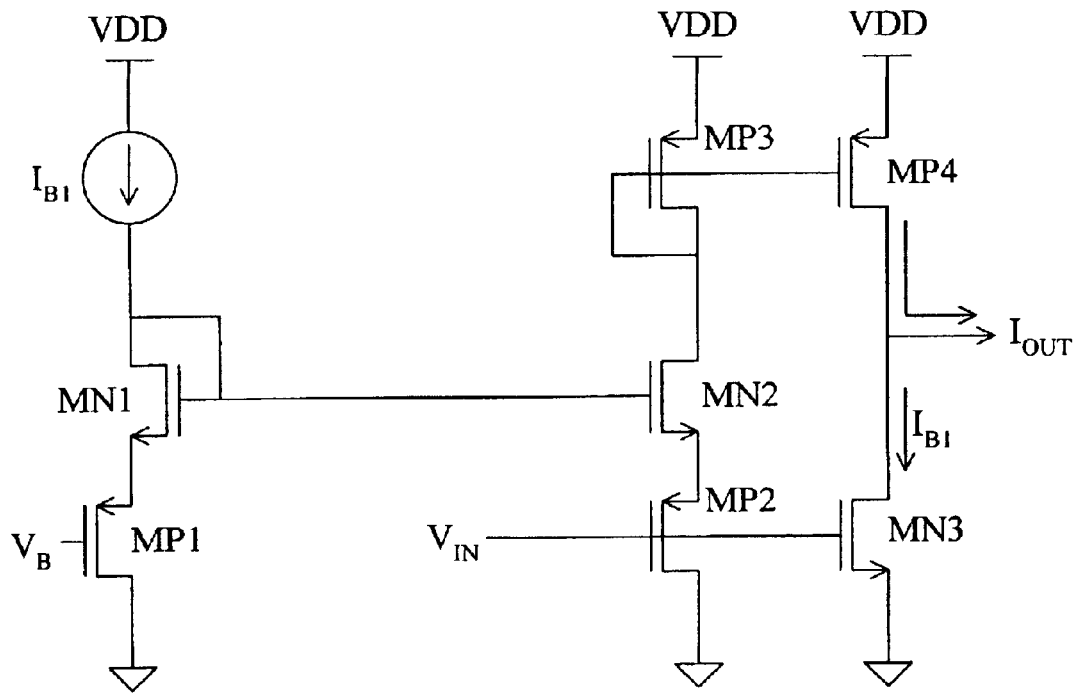
FIG. 1 illustrates a conventional circuit displaying inadequate output current sourcing capability ($I_{OUT}$)

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used in interpreting the claims.

Moreover, features and procedures whose implementations are well known to those skilled in the art are omitted for brevity. For example, design and implementation of basic electronic circuit elements such as current sources, voltage sources, and MOSFETs, lies within the ability of those skilled in the art, and accordingly any detailed discussion thereof may be omitted.

Figure 2:
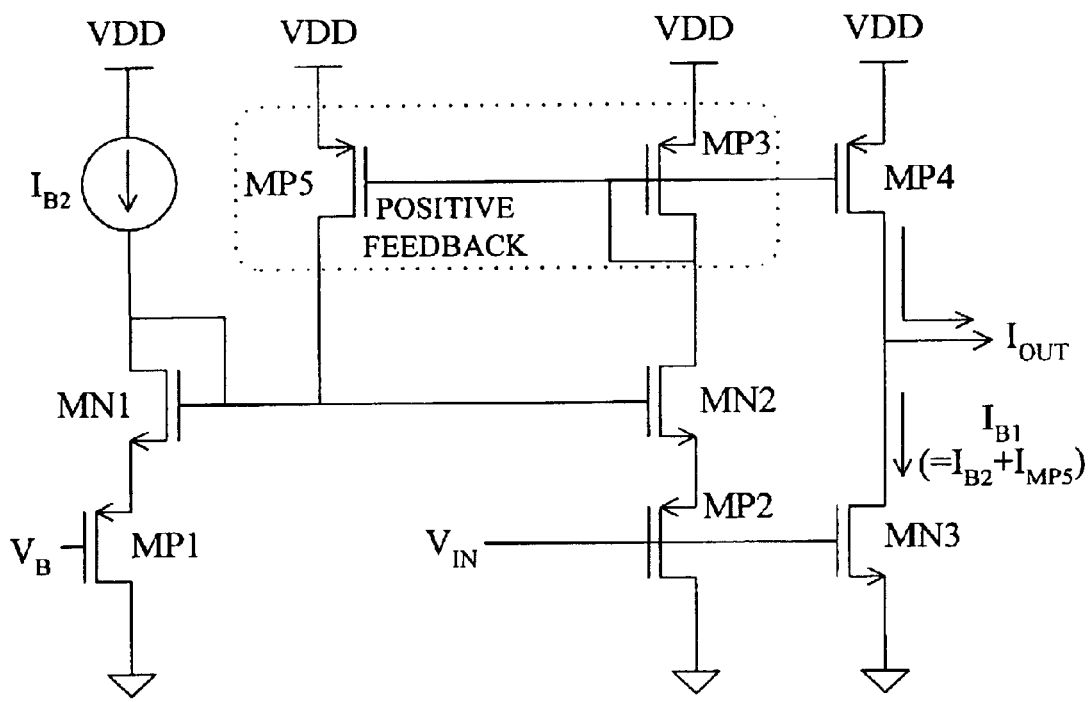
FIG. 2 illustrates one embodiment of a circuit that provides improved output current sourcing capability (maximum $I_{OUT}$) through use of positive feedback in the form of a MOSFET MP5.

FIG. 2 illustrates one embodiment of a circuit that provides improved maximum output current sourcing capability (maximum $I_{OUT}$) through use of positive feedback. The improved capability is achieved with minimal additional circuitry, while avoiding adverse impact on other circuit performance parameters such as, for example, power supply rejection ratio performance.

Referring more specifically to FIG. 2, various elements are shown connected between DC voltage source VDD and ground (which may be a relative ground). In the illustrated embodiment, elements whose designators begin with "MP" (MP1, MP2, MP3, MP4) are implemented as p-channel MOSFETs, and elements whose designators begin with "MN" (MN1, MN2, MN3) are implemented as n-channel MOSFETs. Of course, alterations and variations of this implementation, such as use of JFETs, or use of transistors of different channel conductivity types (n versus p), and variation of voltage supply and supply arrangements, lie within the contemplation of the invention.

First, a current source $I_{B2}$, driven by VDD, drives the drain of MOSFET MN1. MN1's source drives the source of MOSFET MP1 and MN1's gate is tied to its drain. The drain of MP1 is connected to ground, while its gate receives a bias voltage $V_B$.

Second, MP3's source is connected to VDD, and its gate and drain are connected to the drain of MN2. MN2's gate is connected to the gate (and drain) of MN1 at a central node, and MN2's source is connected to the source of MP2. MP2's drain is connected to ground, and its gate is driven by an input voltage $V_{IN}$.

Third, MP4's source is connected to VDD, and its gate is connected to the gate of MP3. MP4's drain drives the overall output of the output stage, sourcing a current $I_{OUT}$. MP4's drain is also connected to the drain of MN3, whose gate is connected to $V_{IN}$ and whose source is connected to ground.

The topological connection of the current source, MN1, MN2, MN3, MP1, MP2, MP3 and MP4 parallels that of the Background Art circuit of FIG. 1. However, positive feedback provides the FIG. 2 embodiment with operational characteristics superior to those of Background Art circuit of FIG. 1.

Specifically, in the illustrated embodiment, an additional MOSFET MP5 is connected as a positive feedback element between MP3/MP4 and the central node between MN1 and MN2. More specifically, MP5's source is connected to VDD, the gate of MP5 is connected to the gates of MP3 and MP4, and the drain of MP5 is connected to the gate (and drain) of MN1 and to the gate of MN2. The operation of positive feedback element MP5 in the context of the circuit of FIG. 2 is better understood with reference to the following discussion.

To improve the current sourcing capability over that of the circuit in FIG. 1, more "headroom" is required for MP2 and MN2. As used herein, "headroom" means the maximum possible voltages across MP2 and MN2. It is desirable to increase these voltages so that they are not as limited as they are in FIG. 1.

To improve the headroom for MP2, the gate voltage of MN2 is dynamically biased in real time. In this implementation, an active feedback (from MP3 to MP5) is provided in the circuit in FIG. 2. To simplify the explanation, it is assumed that the sizes of all transistors are the same, except for MP5. If $I_{B2}$ is arbitrarily set to a portion of $I_{B1}$ (FIG. 1), and recognizing the current mirroring properties of the circuit from MP3 to MN3, MP5 can always be sized to satisfy the condition:

$$I_{MP5} + I_{B2} = I_{MP3} = I_{B1}$$

When $V_{IN}$ swings an incremental amount $\Delta V$ below $V_B$, the current increment is mirrored to reference transistors MP1 and MN1. The current increment forces $V_{GS}$ of both MP1 and MN1 to increase. The gate voltage common to MN1 and MN2 increases, thus creating the desired extra "headroom" for MN2 and MP2, hence more $V_{GS}$ overdrive for both transistors, a basis for ultimately increasing maximum $I_{OUT}$.

The feedback through MP5 is local (internal to the output stage), so that loop delay is minimal and response is fast.

The maximum achievable sourcing current $I_{OUT}$ is limited by the supply when the gate of MN2 is pulled up to the supply rail by the positive feedback MP5. The output stage illustrated in FIG. 2 is stable as long as MP5 is kept smaller than MP3, so that the gain of the positive feedback is less than one.

To verify correct operation of the embodiment of FIG. 2 as compared to the Background Art circuit of FIG. 1, first and second amplifiers designed with TI 0.35 micron CMOS technology with Class AB output stages were simulated with SPICE. The first amplifier AMP_A was implemented with the feedback arrangement of FIG. 2, with feedback current being 75% of the biasing current for reference transistor MP3. The second amplifier AMP_B was implemented according to the Background Art circuit of FIG. 1 (without feedback).

Figure 3A:
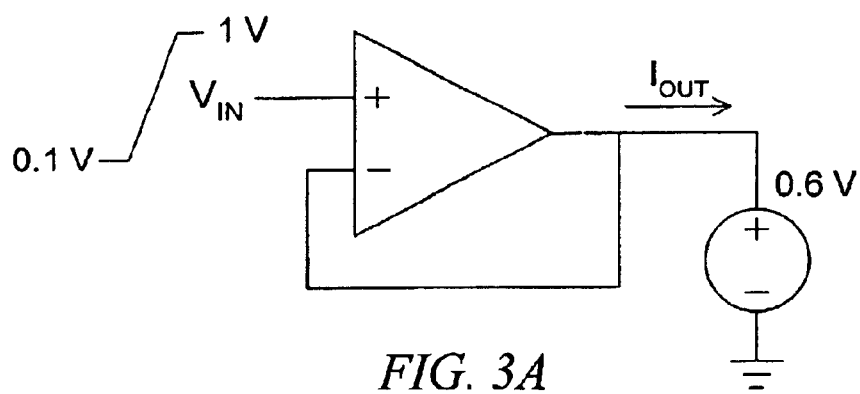
FIGS. 3A and 3B respectively illustrate a test circuit diagram and related output source currents while using drivers according to the embodiment of FIG. 2 (AMP_A, top curve, indicated by "x" points) and according to the Background Art circuit of FIG. 1 (AMP_B, bottom curve, indicated by "+" points)
Figure 3B:
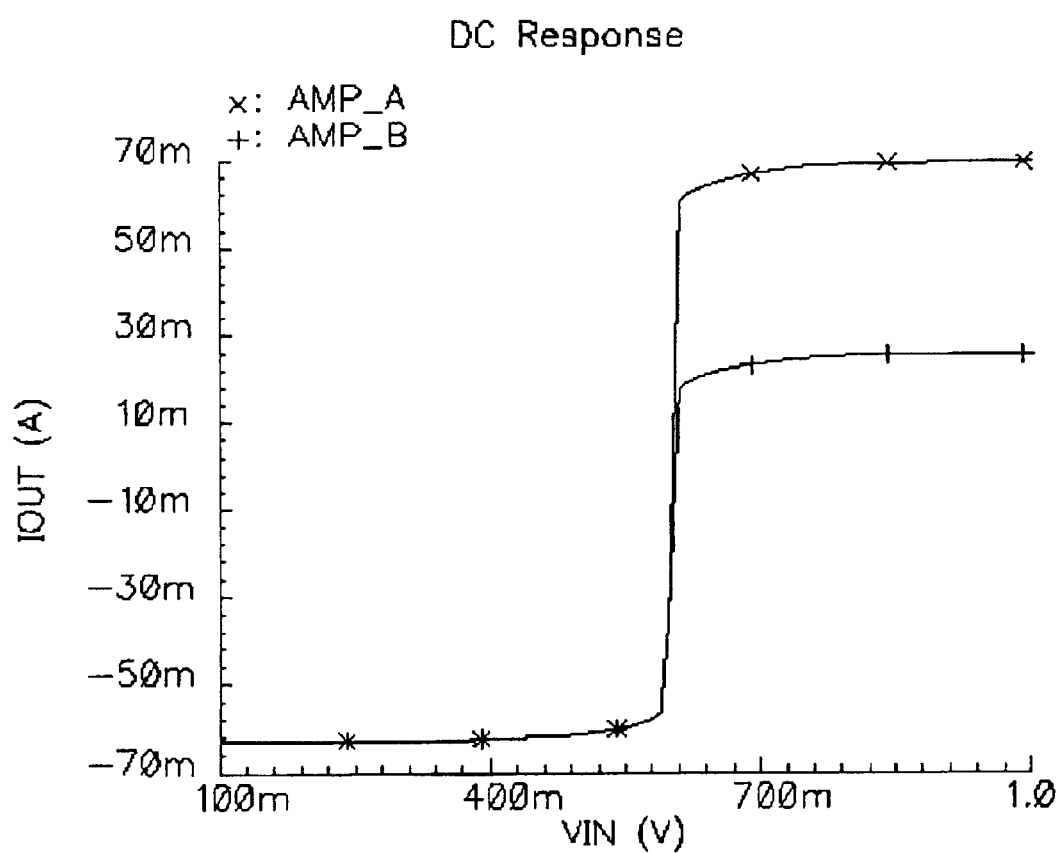

During a first simulation (see FIG. 3A), both amplifiers were set up as unity gain buffers. The output of each amplifier was clamped at 0.6 V, and the input $V_{IN}$ of each buffer was swept from DC 0.1 V to 1.0 V. The simulation results are shown in FIG. 3B. Although the two amplifiers had identical output voltage, the first amplifier (shown as AMP_A according to the embodiment of FIG. 2) was able to source almost three times more current (shown with points "x" in FIG. 3B) than the second amplifier (shown as AMP_B according to the circuit of FIG. 1 and shown with points "+"). Thus, with the additional active feedback provided in the embodiment of FIG. 2, it has been shown that output stage current sourcing capability is significantly improved.

Figure 4A:
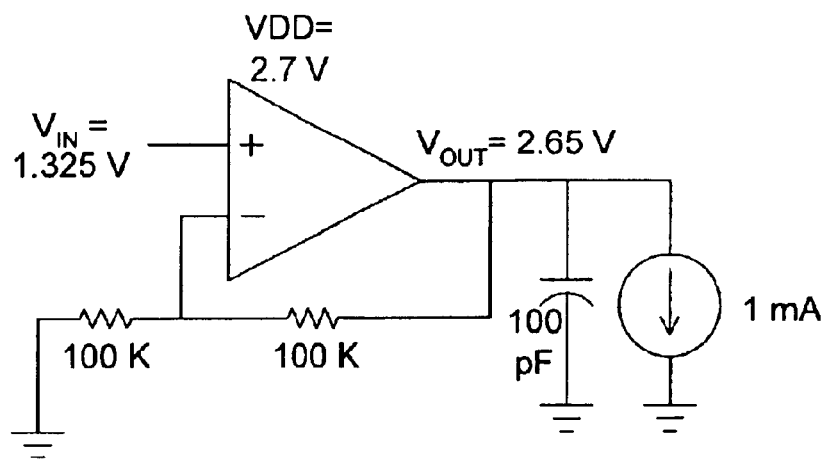
FIGS. 4A and 4B respectively illustrate a test circuit diagram and related power supply rejection ratios (PSRRs) using drivers according to the embodiment of FIG. 2 (AMP_A, bottom curve, indicated by "x" points) and according to the Background Art circuit of FIG. 1 (AMP_B, top curve, indicated by "+" points)
Figure 4B:
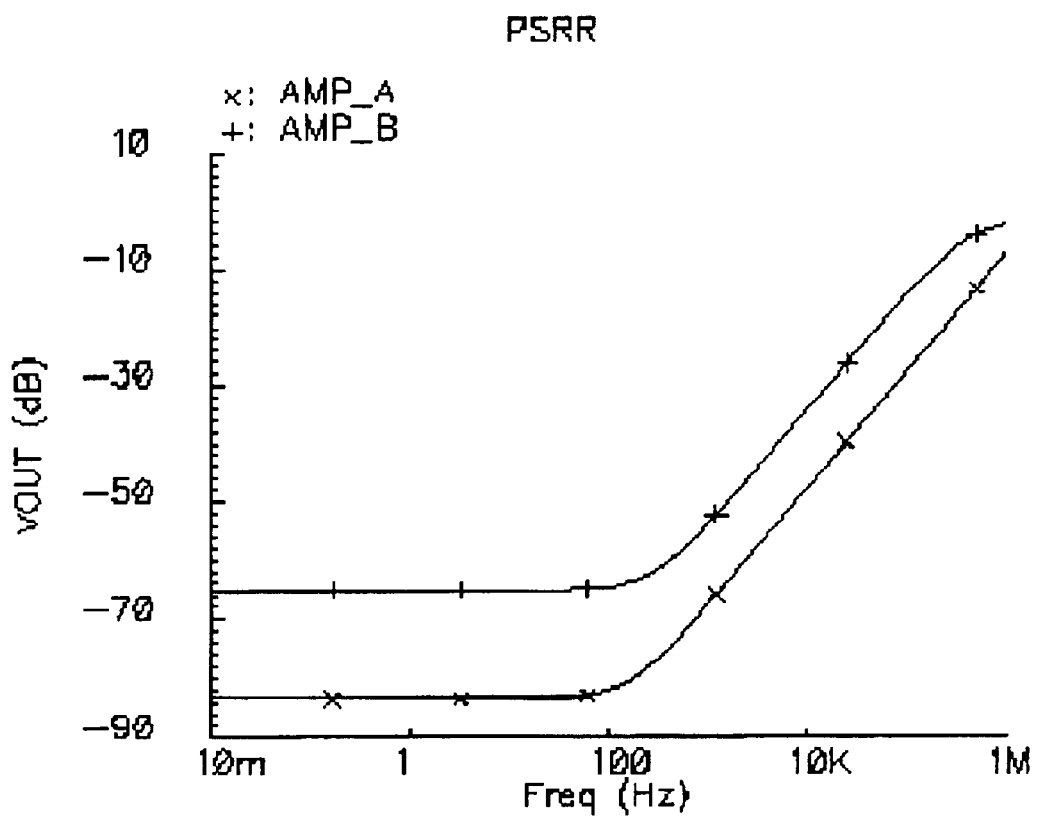

FIG. 4A illustrates an additional simulation setup to determine power supply rejection ratio (PSRR) performance, the simulation result comparison being shown in FIG. 4B. The plots in FIG. 4B are the frequency responses from a small signal analysis simulation, in which the horizontal axis is the frequency of an input (in this case, power supply voltage ripple), and in which the plots represent the ratio of the output to the input at various frequencies. The first amplifier (AMP_A, bottom curve, "x" points) performs better than the second amplifier (AMP_B, top curve, "+" points) because the DC gain of the output stage of the first amplifier is enhanced by the local positive feedback. Improved DC gain results in better PSRR. Thus, the increased maximum source current ($I_{OUT}$, FIG. 3B) provided by output stages constructed in accordance with the teachings of FIG. 2 is not achieved through compromise of other circuit parameters such as power supply rejection ratio (FIG. 4B). Indeed, PSRR is one additional parameter that is actually improved by addition of positive feedback.

Figure 5:
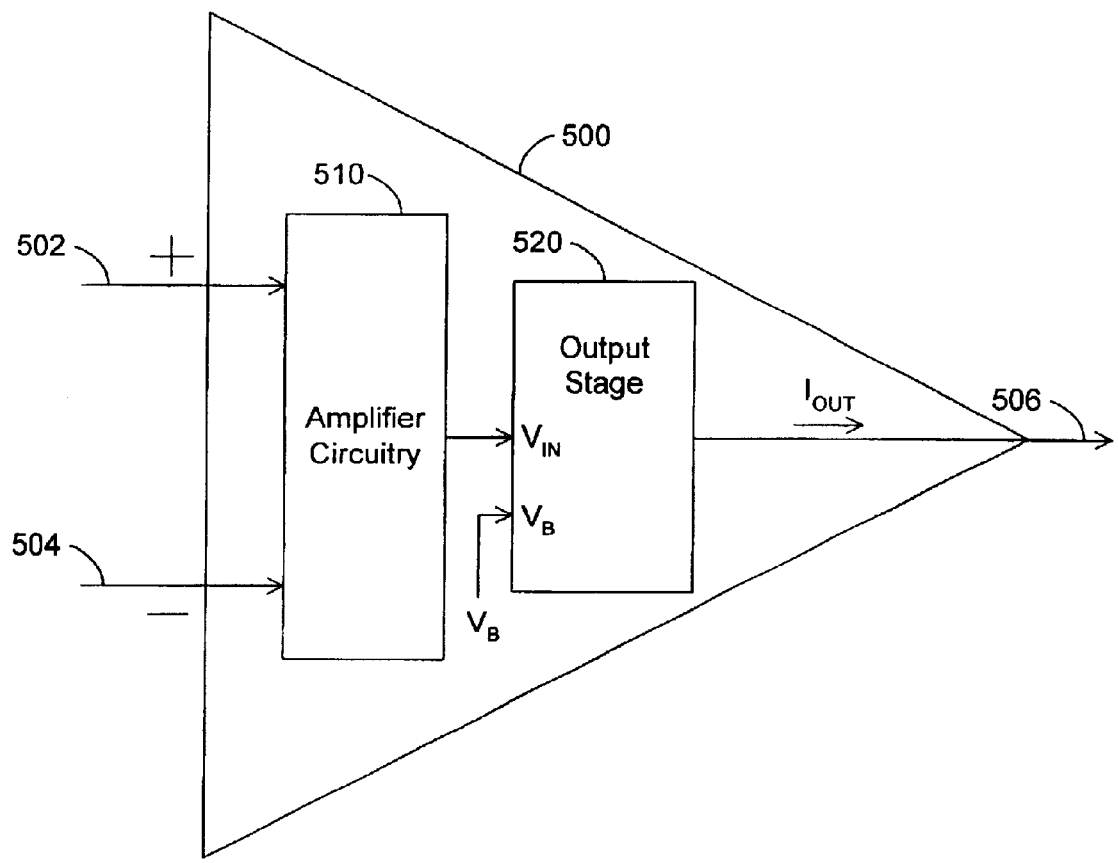
FIG. 5 is a simplified schematic diagram illustrating an amplifier 500 that includes an output stage 520 that may be implemented according to the circuit of FIG. 2.

FIG. 5 is a simplified schematic diagram illustrating an amplifier 500 that includes a non-inverting input 502, an inverting input 504, and an output 506. Amplifier 500 includes amplifier circuitry 510 that may be conventional in design. However, amplifier 500 has an output stage 520 that may be implemented according to the circuit of FIG. 2. Like the circuit of FIG. 2, output stage 520 has a signal input $V_{IN}$, a bias input $V_B$, and an output sourcing an output current $I_{OUT}$. Amplifier 500 may be any suitable amplifier, such as a Class AB amplifier. It may be implemented as the output stage of any larger circuit such as a digital-to-analog converter (DAC).

From the foregoing, it will be apparent to those skilled in the art that a variety of circuits, apparatus, arrangements, methods, and the like, are provided.

For example, there is provided an output stage for providing an increased current source output. The output stage has a first circuit element (MP2) that carries a first current that varies in accordance with an input voltage (VIN) and a feedback voltage (gate of MN2) that includes a first voltage across the first circuit element (MP2). The output stage also has a positive feedback arrangement (MP5) that dynamically increases the feedback voltage (gate of MN2) in response to an increase in at least the first current (through MP2), to supplement an increase in the first current beyond that caused by a change in the input voltage alone. The output stage also has a second circuit element (MP4) that provides the increased current source output as a mirror of the first current.

The first circuit element (MP2) may be a first transistor having a gate that receives the input voltage, the positive feedback arrangement may include a feedback transistor (MP5) having a gate that is connected to a gate of a further transistor (MP3) that carries the first current, and the second circuit clement (MP4) may be a second transistor that carries the increased current source output ($I_{OUT}$) as a mirror of the first current through the first transistor (MP2).

The further transistor (MP3) that is a p-channel MOSFET, an n-channel MOSFET (MN2) that receives the feedback voltage, and the first transistor (MP2) that is a p-channel MOSFET, may be connected in series between a voltage source and ground. The second circuit element (MP4) that is a p-channel MOSFET having a gate connected to the further transistor (MP3), and an n-channel MOSFET (MN3) having a gate connected to the gate of the first circuit element (MP2), may be connected in series between the voltage source and the ground.

The output stage may also have an n-channel reference MOSFET (MN1) having a gate that receives the feedback voltage, as well as a p-channel reference MOSFET (MP1), connected between the n-channel reference MOSFET and ground, and having a gate that receives a bias reference voltage.

Also provided is a method of providing an increased current source output ($I_{OUT}$) from an output stage having a first circuit element (MP2) that carries a first current that varies in accordance with an input voltage (VIN), and a second circuit clement (MP4) that provides the increased current source output as a mirror of the first current. The method involves using a positive feedback arrangement (MP5), dynamically increasing a feedback voltage (gate of MN2) that includes a first voltage across the first circuit element (MP2), in response to an increase in at least the first current (through MP2), so as to supplement an increase in the first current beyond that caused by a change in the input voltage alone, so that the current source output ($I_{OUT}$) as a mirror of the first current (through MP2) also increases beyond an increase caused by a change in the input voltage alone.

The step of dynamically increasing the feedback voltage may include connecting a gate voltage of a further transistor (MP3) that carries the first current, to a gate of a feedback transistor (MP5) in the positive feedback arrangement, so that the feedback transistor increases the first voltage across the first circuit element and supplements the increase in the first current beyond that caused by the change in the input voltage alone.

Also provided is an arrangement for providing an increased current source output ($I_{OUT}$) from an output stage having a first circuit element (MP2) that carries a first current that varies in accordance with an input voltage ($V_{IN}$), and a second circuit element (MP4) that provides the increased current source output as a mirror of the first current. The arrangement includes a positive feedback arrangement (MP5) configured to dynamically increase a feedback voltage (gate of MN2) that includes a first voltage across the first circuit element (MP2), in response to an increase in at least the first current (through MP2), so as to supplement an increase in the first current beyond that caused by a change in the input voltage alone, so that the current source output ($I_{OUT}$) as a mirror of the first current (through MP2) also increases beyond an increase caused by a change in the input voltage alone.

The positive feedback arrangement may include a feedback transistor (MP5) having a gate connected to receive a gate voltage of a further transistor (MP3) that carries the first current, and configured to increase the first voltage across the first circuit element (MP2) and supplement the increase in the first current (through MP2) beyond that caused by the change in the input voltage alone.

Also provided is an output stage for providing an increased current source output. The output stage has, in series, a current source, a first transistor (MN1) having a gate connected to a central node (gates of MN1, MN2), and a second transistor (MP1) having a gate that receives a bias voltage. The output stage also has, in series, a reference transistor (MP3), a third transistor (MN2) having a gate connected to the central node (gates of MN1, MN2), and a fourth transistor (MP2) carrying a first current and having a gate receiving an input voltage. The output stage further has, in series, a current sourcing transistor (MP4) having a gate connected to the gate of the reference transistor, and a current sinking transistor (MN3) having a gate connected to the input voltage. The output stage additionally has a feedback transistor (MP5) that dynamically increases a feedback voltage at the central node (gates of MN1, MN2) in response to an increase in at least the first current (through MP2), to supplement an increase in the first current beyond that caused by a change in the input voltage alone, so that the current sourcing transistor (MP4) provides the increased current source output as a mirror of the first current.

Also provided is an amplifier having the output stage described above.

The foregoing embodiments are merely examples and are not to be construed as limiting the invention. The description of the embodiments is intended to be illustrative, and not to limit the scope of the claims. Many alternatives, modifications, and variations will be apparent to those skilled in the art in light of the above teachings. For example, the choice of transistors other than MOSFETs, or of different conductivity types, or of different circuit configurations, lie within the scope of the present invention. It is therefore to be understood that within the scope of the appended claims and their equivalents, the invention may be practiced otherwise than as specifically described herein.

What is claimed is:

1. An output stage for providing an increased current source output, the output stage comprising:
    a) a first circuit element that carries a first current that varies in accordance with:
        i) an input voltage; and
        ii) a feedback voltage that includes a first voltage across the first circuit element;
    b) a positive feedback arrangement that dynamically increases the feedback voltage in response to an increase in at least the first current, to supplement an increase in the first current beyond that caused by a change in the input voltage alone; and
    c) a second circuit element that provides the increased current source output as a mirror of the first current.

2. The output stage of claim 1, wherein:
    the first circuit element is a first transistor having a gate that receives the input voltage;
    the positive feedback arrangement includes a feedback transistor having a gate that is connected to a gate of a further transistor that carries the first current; and
    the second circuit element is a second transistor that carries the increased current source output as a mirror of the first current through the first transistor.

3. The output stage of claim 2, wherein:
    the further transistor that is a p-channel MOSFET, an n-channel MOSFET that receives the feedback voltage, and the first transistor that is a p-channel MOSFET, are connected in series between a voltage source and ground; and the second circuit element that is a p-channel MOSFET having a gate connected to the further transistor, and an n-channel MOSFET having a gate connected to the gate of the first circuit element, are connected in series between the voltage source and the ground.

4. The output stage of claim 3, further comprising:

an n-channel reference MOSFET having a gate that receives the feedback voltage; and a p-channel reference MOSFET, connected between the n-channel reference MOSFET and ground, and having a gate that receives a bias reference voltage.

5. A method of providing an increased current source output from an output stage having a first circuit element that carries a first current that varies in accordance with an input voltage, and a second circuit element that provides the increased current source output as a mirror of the first current, the method comprising:

using a positive feedback arrangement, dynamically increasing a feedback voltage that includes a first voltage across the first circuit element, in response to an increase in at least the first current, so as to supplement an increase in the first current beyond that caused by a change in the input voltage alone, so that the current source output as a mirror of the first current also increases beyond an increase caused by a change in the input voltage alone.

6. The method of claim 5, wherein the step of dynamically increasing the feedback voltage includes:

connecting a gate voltage of a further transistor that carries the first current, to a gate of a feedback transistor in the positive feedback arrangement, so that the feedback transistor increases the first voltage across the first circuit element and supplements the increase in the first current beyond that caused by the change in the input voltage alone.

7. An arrangement for providing an increased current source output from an output stage having a first circuit element that carries a first current that varies in accordance with an input voltage, and a second circuit element that provides the increased current source output as a mirror of the first current, the arrangement comprising:

a positive feedback arrangement configured to dynamically increase a feedback voltage that includes a first voltage across the first circuit element, in response to an increase in at least the first current, so as to supplement an increase in the first current beyond that caused by a change in the input voltage alone, so that the current source output as a mirror of the first current also increases beyond an increase caused by a change in the input voltage alone.

8. The arrangement of claim 7, wherein the positive feedback arrangement includes:

a feedback transistor having a gate connected to receive a gate voltage of a further transistor that carries the first current, and configured to increase the first voltage across the first circuit element and supplement the increase in the first current beyond that caused by the change in the input voltage alone.

9. An output stage for providing an increased current source output, the output stage comprising:

a) in series, a current source, a first transistor having a gate connected to a central node, and a second transistor having a gate that receives a bias voltage;

b) in series, a reference transistor, a third transistor having a gate connected to the central node, and a fourth transistor carrying a first current and having a gate receiving an input voltage;

c) in series, a current sourcing transistor having a gate connected to the gate of the reference transistor, and a current sinking transistor having a gate connected to the input voltage; and d) a feedback transistor that dynamically increases a feedback voltage at the central node in response to an increase in at least the first current, to supplement an increase in the first current beyond that caused by a change in the input voltage alone, so that the current sourcing transistor provides the increased current source output as a mirror of the first current.

10. An amplifier comprising amplifier circuitry and an output stage for providing an increased current source output for the amplifier, the output stage including:

a) a first circuit element that carries a first current that varies in accordance with:
i) an input voltage; and
ii) a feedback voltage that includes a first voltage across the first circuit element;

b) a positive feedback arrangement that dynamically increases the feedback voltage in response to an increase in at least the first current, to supplement an increase in the first current beyond that caused by a change in the input voltage alone; and c) a second circuit element that provides the increased current source output as a mirror of the first current.

11. The amplifier of claim 10, wherein:

the first circuit element is a first transistor having a gate that receives the input voltage;

the positive feedback arrangement includes a feedback transistor having a gate that is connected to a gate of a further transistor that carries the first current; and the second circuit element is a second transistor that carries the increased current source output as a mirror of the first current through the first transistor.

12. The amplifier of claim 11, wherein:

the further transistor that is a p-channel MOSFET, an n-channel MOSFET that receives the feedback voltage, and the first transistor that is a p-channel MOSFET, are connected in series between a voltage source and ground; and the second circuit element that is a p-channel MOSFET having a gate connected to the further transistor, and an n-channel MOSFET having a gate connected to the gate of the first circuit element, are connected in series between the voltage source and the ground.

13. The amplifier of claim 12, wherein the output stage further includes:

an n-channel reference MOSFET having a gate that receives the feedback voltage; and a p-channel reference MOSFET, connected between the n-channel reference MOSFET and ground, and having a gate that receives a bias reference voltage.

* * * * *